United States Patent
Choi et al.

(10) Patent No.: US 10,095,201 B2
(45) Date of Patent: Oct. 9, 2018

(54) RECONFIGURABLE CONTROL SYSTEM FOR CONTROLLING A TARGET APPARATUS, AND METHOD FOR RECONFIGURATION DURING OPERATION OF THE CONTROL SYSTEM

(75) Inventors: Seong Hun Choi, Busan (KR); Min Soo Kim, Daejeon (KR); Young Jun Park, Daejeon (KR); Young Youl Ha, Seoul (KR)

(73) Assignee: Samsung Heavy Ind. Co., Ltd., Seoul (KR)

( * ) Notice: Subject to any disclaimer, the term of this patent is extended or adjusted under 35 U.S.C. 154(b) by 644 days.

(21) Appl. No.: 13/880,700

(22) PCT Filed: Nov. 5, 2010

(86) PCT No.: PCT/KR2010/007795
§ 371 (c)(1),
(2), (4) Date: Apr. 19, 2013

(87) PCT Pub. No.: WO2012/053687
PCT Pub. Date: Apr. 26, 2012

(65) Prior Publication Data
US 2013/0297043 A1   Nov. 7, 2013

(30) Foreign Application Priority Data
Oct. 22, 2010  (KR) .................. 10-2010-0103627

(51) Int. Cl.
*G05B 15/02* (2006.01)
*G06F 13/12* (2006.01)
(Continued)

(52) U.S. Cl.
CPC .......... *G05B 15/02* (2013.01); *G06F 13/124* (2013.01); *H03K 19/17752* (2013.01); *H03K 19/17776* (2013.01); *H02P 5/46* (2013.01)

(58) Field of Classification Search
None
See application file for complete search history.

(56) References Cited

U.S. PATENT DOCUMENTS

| | | | |
|---|---|---|---|
| 2005/0289274 A1* | 12/2005 | Ghercioiu | G06F 8/51 710/303 |
| 2006/0092858 A1* | 5/2006 | Kynast | H04L 12/403 370/254 |
| 2007/0150155 A1* | 6/2007 | Kawai | A61B 1/00059 701/72 |

FOREIGN PATENT DOCUMENTS

| | | |
|---|---|---|
| JP | 09298897 A | 11/1997 |
| JP | 2001322078 A | 11/2001 |

(Continued)

OTHER PUBLICATIONS

Office Action dated Jun. 10, 2014 in JP Application No. 2013-534789.
International Search Report of PCT/KR2010/007795.

*Primary Examiner* — Mohammad Ali
*Assistant Examiner* — Saad M Kabir
(74) *Attorney, Agent, or Firm* — Locke Lord LLP; Daniel J. Fiorello

(57) ABSTRACT

A control system that is reconfigurable during operation comprises a master controller which generates a bit stream, including reconfiguration information, according to the command of a user. The first slave controller comprises: a first dynamic reconfiguration module, which is a field programmable gate array (FPGA) reconfigured according to the reconfiguration information, and which calculates a control value; a static reconfiguration module which is an FPGA controlling the operation of a target apparatus according to the control value; and a control unit reconfiguring one or (Continued)

more of the first dynamic reconfiguration module and the static reconfiguration module according to the reconfiguration information.

7 Claims, 5 Drawing Sheets

(51) Int. Cl.
    *H03K 19/177*     (2006.01)
    *H02P 5/46*     (2006.01)

(56) References Cited

FOREIGN PATENT DOCUMENTS

| | | |
|---|---|---|
| JP | 2001331222 A | 11/2001 |
| JP | 2005275938 A | 10/2005 |
| JP | 2007014092 A | 1/2007 |
| JP | 2009278858 A | 11/2009 |
| KR | 200409311 Y1 | 2/2006 |
| KR | 100762366 B1 | 10/2007 |
| KR | 100827787 B1 | 5/2008 |

\* cited by examiner

RECONFIGURABLE CONTROL SYSTEM FOR CONTROLLING A TARGET APPARATUS, AND METHOD FOR RECONFIGURATION DURING OPERATION OF THE CONTROL SYSTEM

CROSS-REFERENCE TO RELATED APPLICATIONS

This application is the national phase under 35 U.S.C. § 371 of PCT International Application No. PCT/KR2010/007795, filed Nov. 5, 2010, which claims priority to Korean Application No. 10-2010-0103627, filed Oct. 22, 2010, the entire contents of the aforementioned application is hereby incorporated herein by reference.

TECHNICAL FIELD

The present invention relates to a control system and a method therefor, more specifically to a control system that is reconfigurable during operation and a method therefor.

BACKGROUND ART

Robots and similar devices use servo motors for their operation. Operations of the devices can be controlled by controlling the servo motors.

Generally, a master controller and slave controllers are used to perform an operation control. The master controller sends a control signal to each of the slave controllers, and each slave controller controls the servo motor corresponding to the control signal. The master controller can be connected with a plurality of slave controllers, and each slave controller controls the corresponding servo motor.

The slave controller normally has a functional board package that is appropriate for the operation of the servo motor. However, the slave controller has a shortcoming that the slave controller can control the corresponding servo motor only. In other words, in case the servo motor is replaced with another model, the slave controller also needs to be replaced.

DISCLOSURE

TECHNICAL PROBLEM

The present invention provides a control system, and a method therefor, which is reconfigurable during an operation of changing a control method of a device by reconfiguring the structure of FPGA (Field Programmable Gate Array) while maintaining the control of the device.

TECHNICAL SOLUTION

An aspect of the present invention features a control system that is reconfigurable during operation. The control system according to one embodiment of the present invention comprises a master controller which generates a bit stream, including reconfiguration information, according to the command of a user. The first slave controller comprises: a first dynamic reconfiguration module, which is a field programmable gate array (FPGA) reconfigured according to the reconfiguration information, and which calculates a control value; a static reconfiguration module which is an FPGA controlling the operation of a target apparatus according to the control value; and a control unit reconfiguring one or more of the first dynamic reconfiguration module and the static reconfiguration module according to the reconfiguration information.

The control unit can reconfigure an FPGA structure of the dynamic reconfiguration module independently from the operation of the static reconfiguration module.

The slave controller can also include a second dynamic reconfiguration module, which is an FPGA reconfigured according to the reconfiguration information, and which computes a control value, and the control unit can control the second dynamic reconfiguration module to be reconfigured according to the reconfiguration information if the capacity of the reconfiguration information is greater than a predetermined value and maintain the operation of the first dynamic reconfiguration module until the second dynamic reconfiguration module is completely reconfigured.

The control unit can stop the operation of the first dynamic reconfiguration module if the second dynamic reconfiguration module is completely reconfigured.

The master controller can include: a reconfiguration library storing unit storing function information indicating a connection relation between gates of the first dynamic reconfiguration module or the static reconfiguration module; a reconfiguration information combining unit extracting the function information according to the command and generating the reconfiguration information by combining the extracted function information; and an entry management unit generating a bitstream including the reconfiguration information.

The control system can also include a slave communication unit transmitting the bitstream to the first slave controller, and if the entry management unit generates reconfiguration time information, which is time for transmitting the bitstream according to the command, the slave communication unit can transmit the bitstream to the first slave controller at every predetermined period or when the bitstream is generated according to the reconfiguration time information.

The control system can also include a second slave controller, which is a controller having the same configuration as the first slave controller, and the master controller can generate the bitstream including reconfiguration information corresponding to each of the first slave controller and the second slave controller.

The master controller, the first slave controller and the second slave controller can be connected in a double-ring structure of network.

In the case that the target apparatus is changed, the static reconfiguration module can be an FPGA that is reconfigured according to the reconfiguration information.

Another aspect of the present invention features a method for a reconfigurable control system to control an operation of a target apparatus. The method in accordance with an embodiment of the present invention can include: generating a bitstream including reconfiguration information according to a command of a user; reconfiguring a first field programmable gate array (FPGA), which is reconfigured according to the reconfiguration information and computes a control value; computing a control value by using the reconfigured FPGA; and transmitting the control value to a second FPGA, which controls the operation of the target apparatus.

The reconfiguring of the first FPGA can be independent from an operation of the second FPGA.

The method can also include reconfiguring a third FPGA, which is reconfigured according to the reconfiguration information and computes a control value, if the capacity of the reconfiguration information is greater than a predetermined value, and an operation of the first FPGA can be maintained until the third FPGA is completely reconfigured.

The method can also include stopping the operation of the first FPGA if the third FPGA is completely reconfigured.

The generating of the bitstream can include: extracting function information from a storage space of the control system that stores the function information indicating a connection relation between gates of the first FPGA or the second FPGA according to the command; generating the reconfiguration information by combining the extracted function information; and generating a bitstream including the reconfiguration information.

MODE FOR INVENTION

Figure 1:
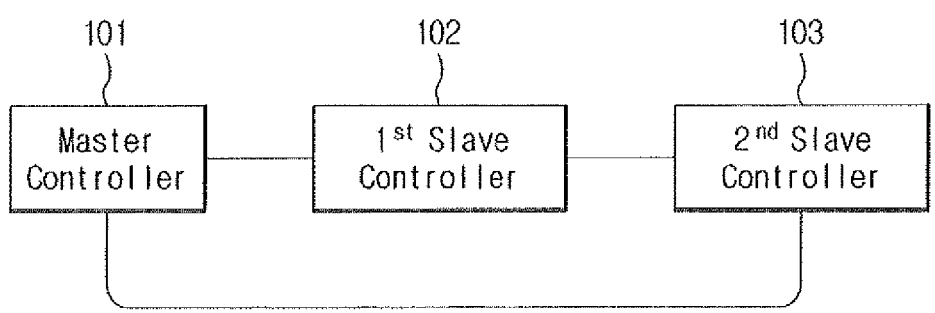
FIG. 1 illustrates a control system.

FIG. 1 illustrates a control system that is reconfigurable during operation in accordance with an embodiment of the present invention.

Referring to FIG. 1, the control system in accordance with an embodiment of the present invention includes a master controller 101, a first slave controller 102 and a second slave controller 103. Although two slave controllers are illustrated in FIG. 1, the control system in accordance with an embodiment of the present invention can include various numbers of slave controllers depending on the environment in which the present invention is used. Moreover, each slave controller can be connected to at least one sensor that senses each servo motor as well as acceleration, heat, etc. of said each servo motor.

The master controller 101 receives a command for an operation from an input device, such as a personal computer (not shown). Here, the command received from the input device is a signal indicating a command of operation in accordance with one of the operation patterns of a servo motor. The master controller 101 can match at least one of reconfiguration information, which instructs reconfiguration of an FPGA (Field Programmable Gate Array) arranged in each slave controller, against the received command and store the reconfiguration information. For example, the master controller 101 can generate a bitstream by including the command received from the input device and reconfiguration information matched against the command.

For example, in case there are two slave controllers 102, 103 as illustrated in FIG. 1, the master controller 101 can generate the bitstream by including at least one of first reconfiguration information corresponding to the first slave controller 102 and second reconfiguration information corresponding to the second slave controller 103.

Hereinafter, the structure of the bitstream will be described in detail with reference to FIG. 2.

Figure 2:
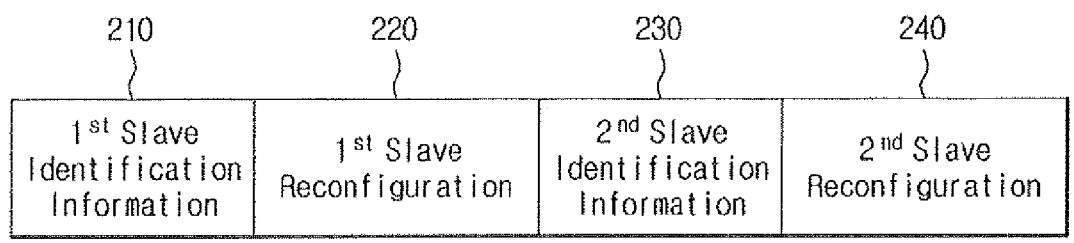
FIG. 2 illustrates an example of a bitstream generated by a master controller of the control system.

FIG. 2 illustrates an example of the structure of a bitstream generated by the master controller of the control system in accordance with an embodiment of the present invention.

The master controller 101 generates a bitstream including reconfiguration information that instructs reconfiguration of the FPGA arranged in the first slave controller 102 and the second slave controller 103, in order to control the servo motors connected to the first slave controller 102 and the second slave controller 103, respectively.

Here, the master controller 101 can allow the reconfiguration information to be placed after slave identification information, which is information for identifying each of the slave controllers, in the bitstream so that each of the slave controllers can readily extract the pertinent reconfiguration information.

For example, in FIG. 2, first slave identification information 210 and first reconfiguration information 220 is slave identification information and reconfiguration information corresponding to the first slave controller 102, and second slave identification information 230 and second reconfiguration information 240 is slave identification information and reconfiguration information corresponding to the second slave controller 103. The first slave controller 102 can search for the first slave identification information 210 included in the bitstream, recognize data between the first slave identification information 210 and next slave identification information as the first reconfiguration information 220, and extract the first reconfiguration information 220 from the bitstream.

Referring back to FIG. 1, the master controller 101 can periodically generate a plurality of bitstreams in response to a command received from the input device.

For example, if the command received from the input device instructs the servo motor to repeat operating and stopping steps at predetermined intervals, the master controller 101 can generate a bitstream including reconfiguration information for performing the operation of the servo motor and a bitstream including reconfiguration information for performing the stopping of the servo motor at predetermined intervals. Hereinafter, the constitution of the master controller 101 will be described in detail with reference to FIG. 3.

Figure 3:
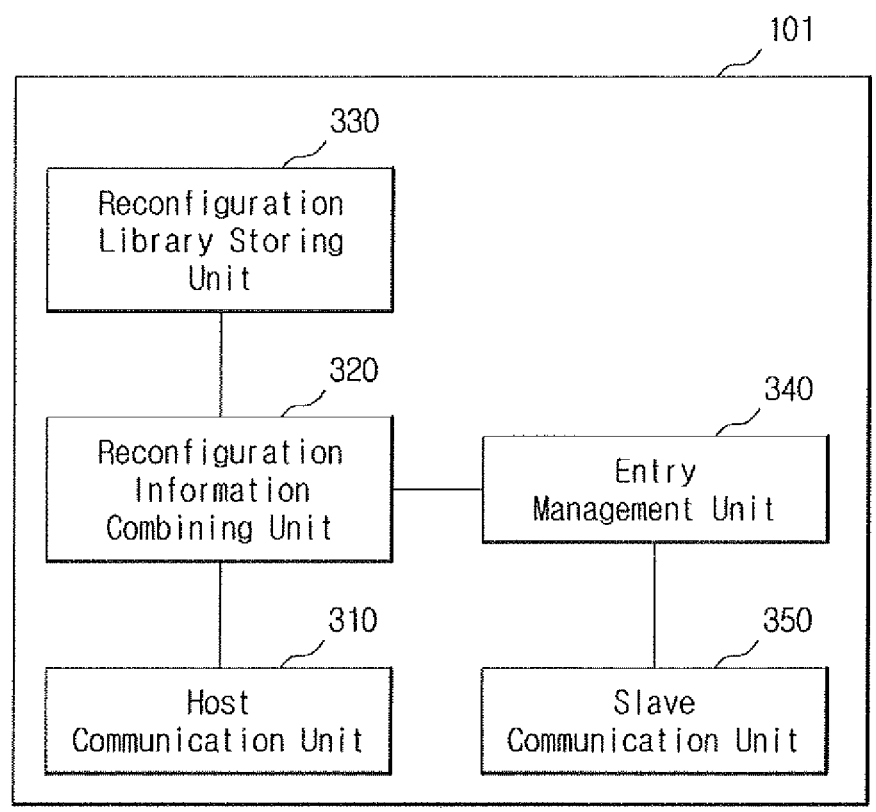
FIG. 3 is a block diagram illustrating a conceptual structure of the master controller.

FIG. 3 is a block diagram illustrating a conceptual structure of the master controller. Referring to FIG. 3, the master controller 101 includes a host communication unit 310, a reconfiguration information combining unit 320, a reconfiguration library storing unit 330, an entry management unit 340 and a slave communication unit 350.

The host communication unit 310 receives a command of a user from the input device through a network. The host communication unit 310 transmits the received command to the reconfiguration information combining unit 320.

The reconfiguration information combining unit 320 extracts one or more of function information stored in the reconfiguration library storing unit according to the command received from the host communication unit 310, and generates reconfiguration information by combining the extracted function information.

Here, the function information in accordance with an embodiment of the present invention can include information on a connection relation between gates of the FPGA of the slave controllers, and can be expressed in various forms, for example, a bit string. Moreover, the FPGA in accordance with an embodiment of the present invention can perform a particular function when the FPGA is reconfigured according to the function information. The steps for generating the reconfiguration information will be described later in detail with reference to FIG. 4. Here, the reconfiguration information combining unit 320 transmits the generated reconfiguration information to the entry management unit 340.

The entry management unit 340 generates reconfiguration time information and reconfiguration mode information, based on the reconfiguration information received from the reconfiguration information combining unit 320.

Here, the reconfiguration time information indicates whether the bitstream including the reconfiguration information will be sent immediately or whenever the slave communication unit 350 sends the bitstream periodically.

The reconfiguration mode information indicates whether each of the slave controllers that received the bitstream will reconfigure the FPGA.

The entry management unit 340 inserts the reconfiguration mode information into the reconfiguration information, generates a bitstream including each of the reconfiguration information and slave identification information, and transmits the bitstream to the slave communication unit 350 together with the reconfiguration time information.

The slave communication unit 350 transmits the bitstream to the first slave controller 102 or the second slave controller 103, depending on the reconfiguration time information. Specifically, if the reconfiguration time information indicates that the bitstream is to be transmitted immediately, the slave communication unit 350 transmits the bitstream to the slave controller immediately, and if the reconfiguration time information indicates that the bitstream is to be transmitted according to a period of transmission, the slave communication unit 350 transmits the bitstream to the slave communication unit 350 at every period of transmission designated.

Referring back to FIG. 1, the master controller 101 transmits the generated bitstream to the first slave controller 102. Here, the master controller 101 can be connected with the first slave controller 102 and the second slave controller 103 in a double-ring structure. Specifically, in case that the bitstream transmitted to the first slave controller 102 by the master controller 101 is not received by the second slave controller 103, the double-ring structure can enable the master controller 101 to retransmit the generated bitstream to the second slave controller 103. Therefore, according to an embodiment of the present invention, a normal operation is possible even if any network among the master controller 101, the first slave controller 102 and the second slave controller 103 is disconnected.

The first slave controller 102 extracts the reconfiguration information from the bitstream received from the master controller 101, reconfigures the FPGA according to the reconfiguration information, and controls the servo motor by use of the reconfigured FPGA. The structure of the first slave controller 102 will be described later in detail with reference to FIG. 5.

Figure 4:
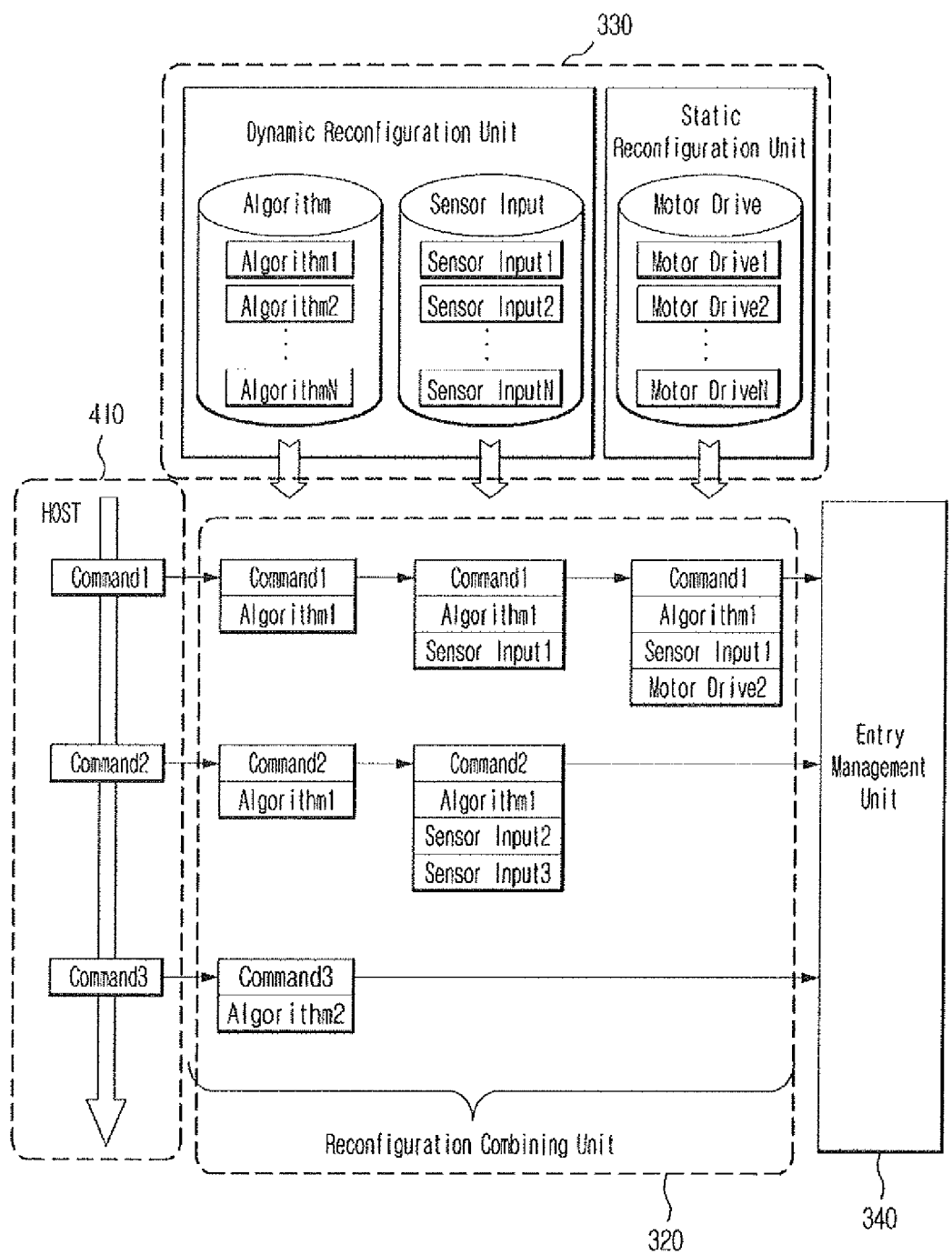
FIG. 4 illustrates an example of how the master controller generates reconfiguration information.

FIG. 4 illustrates an example of how the master controller generates reconfiguration information.

Referring to FIG. 4, the reconfiguration information combining unit 320 of the master controller 101 receives a command from the input device. The reconfiguration information combining unit 320 extracts necessary function information from the reconfiguration storing unit 330 according to the received command. The reconfiguration library storing unit 330 can store one or more function information, the reconfiguration information combining unit 320 can pre-store a list of function information required for reconfiguration of FPGA pursuant to each command that can be received from the user. Accordingly, once a command is received, the reconfiguration information combining unit 320 searches the list of function information matched to the command, extracts function information included in the searched list from the reconfiguration library storing unit 330, and generates reconfiguration information by combining the function information.

For example, the reconfiguration library storing unit 330 can store function information about an algorithm to be performed by the slave controllers, function information indicating a function that receives data from a sensor for sensing the servo motor, and function information indicating a function of controlling an operation of an actual motor. The reconfiguration information combining unit 320 receives COMMAND 1 from an input device 410 and searches the list of function information matched with COMMAND 1. The reconfiguration information combining unit 320 confirms that the function information included in the list of function information is ALGORITHM 1, SENSOR INPUT 1 and MOTOR DRIVE 2, and extracts each of the function information from the reconfiguration library storing unit 330. The reconfiguration information combining unit 320 generates reconfiguration information 420 corresponding to COMMAND 1 by combining the extracted function information. The reconfiguration information combining unit 320 can transmit the reconfiguration information 420 to the entry management unit 340.

Although the master controller 101 is described to generate reconfiguration information by having the reconfiguration information combining unit 320 extract and combine function information, it is also possible that the reconfiguration information combining unit 320 has reconfiguration information corresponding to each command pre-stored therein and transmits the reconfiguration information corresponding to a particular command to the entry management unit 340 when the particular command is received. Accordingly, it is possible that the master controller 101 extracts reconfiguration information without a particular step of combining function information and transmits the reconfiguration information to the entry management unit 340.

Figure 5:
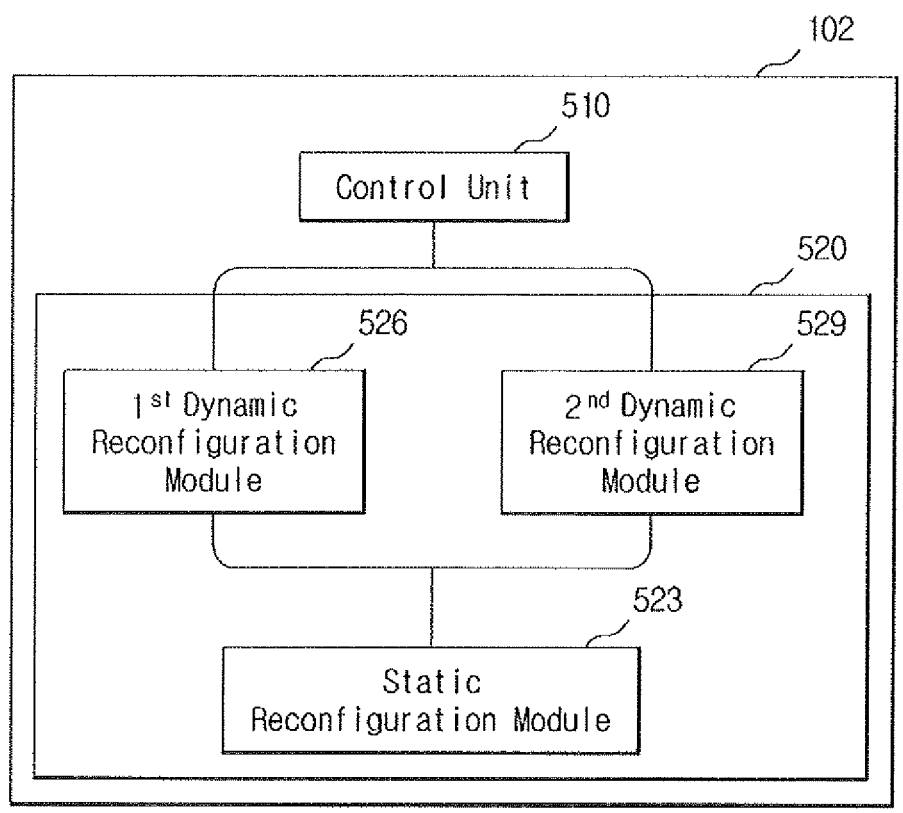
FIG. 5 is a block diagram briefly illustrating functional units constituting a first slave controller.

FIG. 5 is a block diagram briefly illustrating functional units constituting a first slave controller. Referring to FIG. 5, the first slave controller 102 includes a control unit 510 and a reconfiguration unit 520.

The control unit 510 receives a bitstream from the master controller 101 and extracts reconfiguration information from the bitstream. The control unit 510 checks whether reconfiguration mode information included in the reconfiguration information indicates reconfiguration of FPGA. If the reconfiguration mode information does not indicate reconfiguration of FPGA, the control unit 510 does not perform the reconfiguration step of FPGA. If the reconfiguration mode information indicates reconfiguration of FPGA, the control unit 510 reconfigures a gate array structure of the reconfiguration unit 520 according to the reconfiguration information. For example, if the reconfiguration information indicates an FPGA structure in which data is received from the sensor pursuant to sensing the servo motor, and the received data is computed according to a predetermined algorithm, and the servo motor is controlled according to the result of computation, the control unit 510 controls the reconfiguration unit 520 to reconfigure the FPGA according to the reconfiguration information.

Here, although the above-described control unit 510 determined to perform reconfiguration according to the reconfiguration mode information, the control unit 510 in accordance with another embodiment of the present invention can determine whether or not the FPGA needs to be reconfigured, based on whether or not reconfiguration information corresponding to the pertinent slave controller is included in the bitstream.

The reconfiguration unit 520 includes a static reconfiguration module 523, a first dynamic reconfiguration module 526 and a second dynamic reconfiguration module 529 that are constituted with FPGA. The static reconfiguration module 523, which is a module controlling the operation of the servo motor, can control the servo motor to perform rotational acceleration, reverse rotational acceleration, stop, etc. according to a signal received from dynamic reconfiguration modules (i.e., the first dynamic reconfiguration module 526 and the second dynamic reconfiguration module 529). Since the static reconfiguration module 523 directly controls the operation of the servo motor, reconfiguration is not performed while the first slave controller 102 is controlling the operation of the servo motor. However, in the case that the servo motor is substituted with another type of device, the static reconfiguration module 523 can perform reconfiguration. Specifically, in the case that the user provides a command to control the substituted other type of device through the input device, the master controller 101 can transmit a bitstream including the reconfiguration information for reconfiguration of the static reconfiguration unit 523, so as to correspond to said command, to, for example, the control unit 510 of the first slave controller 102. Then, the control unit 510 reconfigures the gate array structure of the static reconfiguration unit 523 according to the reconfiguration information included in the bitstream so that the substituted other type of device can be controlled.

Moreover, the first dynamic reconfiguration module 526 has the FPGA reconfigured according to the control of the control unit 510 but independently from the static reconfiguration module 523. That is, the first dynamic reconfiguration module 526 is reconfigured regardless of whether the static reconfiguration module 523 is currently controlling the servo motor or reconfiguring.

For example, the dynamic reconfiguration module 526 receives a rotary speed of the servo motor from the sensor that detects the rotary speed of the servo motor and can perform computation according to an algorithm predetermined for the rotary speed of the servo motor if the rotary speed is in excess of a designated speed. The dynamic reconfiguration module 523 can transmit a control value, which is the result of computation, to the static reconfiguration module 523. Moreover, the static reconfiguration module 523 can adjust the rotary speed to a speed pursuant to the control value.

In another example of reconfiguring the first dynamic reconfiguration module 526, it is assumed that control of the servo motor requires receiving data successively from a first sensor, a second sensor and a third sensor and performing computation through a first algorithm and that a bitstream for this is generated by the master controller 101. In such a case, the control unit 510 can receive a first bitstream from the master controller 101. Here, the first bitstream includes reconfiguration information indicating an FPGA structure for receiving the data from the first sensor and performing computation through the predetermined first algorithm. Then, the control unit 510 controls the first dynamic reconfiguration module 526 to reconfigure the FPGA structure according to the reconfiguration information. Here, the static reconfiguration module 523 can continue to control the servo motor. After completing the reconfiguration, the first dynamic reconfiguration module 526 receives the data from the first sensor according to the FPGA structure and outputs a control value, which is a value computed through the first algorithm. The first dynamic reconfiguration module 526 sends the control value to the static reconfiguration module 523. The static reconfiguration module 523 continues to control the servo motor according to the control value.

Afterwards, the control unit 510 can receive a second bitstream from the master controller 101. Here, the second bitstream includes reconfiguration information indicating an FPGA structure for receiving the data from the second sensor and performing computation through the first algorithm. Then, after the above-described steps, the first dynamic reconfiguration module 526 is reconfigured to an FPGA structure that allows the data to be received from the second sensor. Moreover, the static reconfiguration module 523 continues to control the servo motor according to the control value.

Afterwards, the control unit 510 can receive a third bitstream from the master controller 101. Here, the third bitstream includes reconfiguration information indicating an FPGA structure for receiving the data from the third sensor and performing computation through the first algorithm. Then, after the above-described steps, the first dynamic reconfiguration module 526 is reconfigured to an FPGA structure that allows the data to be received from the third sensor. Moreover, the static reconfiguration module 523 continues to control the servo motor according to the control value.

Accordingly, the data can be received from the first, second and third sensors successively.

Conventional operation controllers required a module for each sensor in order to receive data from each respective sensor if data is received from the sensors successively, and accordingly had to have a sufficiently large circuit inevitably. However, it is possible for the first slave controller 510 to use one dynamic reconfiguration module 526 to receive data successively from the sensors for controlling the servo motor while using the static reconfiguration module 523 to maintain the control of the servo motor. Accordingly, this control system can be made relatively smaller than the conventional operation controllers.

Here, the functions of the static reconfiguration module 523 and the first dynamic reconfiguration module 526 are not restricted to what are described herein. In other words, the functions of the static reconfiguration module 523 and the first dynamic reconfiguration module 526 can vary depending on the reconfiguration information of bitstream received by the control unit 510.

The second dynamic reconfiguration module 529 has the same configuration as that of the first dynamic reconfiguration module 526 and can be reconfigured through the same reconfiguration steps as those of the first dynamic reconfiguration module 526.

In another embodiment of the present invention, the control unit 510 can reconfigure the FPGA structure of the first dynamic reconfiguration module 526 or the second dynamic reconfiguration module 529, depending on the capacity of the reconfiguration information extracted from the bitstream.

For example, if it is supposed that the first dynamic reconfiguration module 526 is currently operating, the control unit 510 reconfigures the FPGA of the second dynamic reconfiguration module 529, which is currently not operating, according to the reconfiguration information if the capacity of the reconfiguration information is greater than a predetermined capacity. After the reconfiguration is completed, the second dynamic reconfiguration module 529 sends a reconfiguration completion signal, which notifies that the reconfiguration is completed, to the control unit 510. Once the reconfiguration completion is received, the control unit 510 sends an operation stop request for requesting the operation to be stopped to the first dynamic reconfiguration module 526, which is currently operating. The first dynamic reconfiguration module 526 stops the operation according to the operation stop request. Here, the second dynamic reconfiguration module 529, in which the FPGA structure is reconfigured according to the reconfiguration information, performs computation and sends the result of computation tot the static reconfiguration module 523. Then, upon receiving the result of computation from the second dynamic reconfiguration module 529, the static reconfiguration module 523 can control the servo motor.

Although it is described above that the control unit 510 determines whether the capacity of the reconfiguration information of the bitstream received from the master controller 101 is greater than a predetermined value, it is also possible in another embodiment that the master controller 101 determines that the entry management unit 340 of the master controller 101 determines whether the capacity of the reconfiguration information is greater than the predetermined value and insert information corresponding to the determination into a header of the reconfiguration information. Here, the control unit 510 can check the information in the header of the reconfiguration information and perform the reconfiguration steps of the first dynamic reconfiguration module 526 or the second dynamic reconfiguration module 529.

Figure 6:
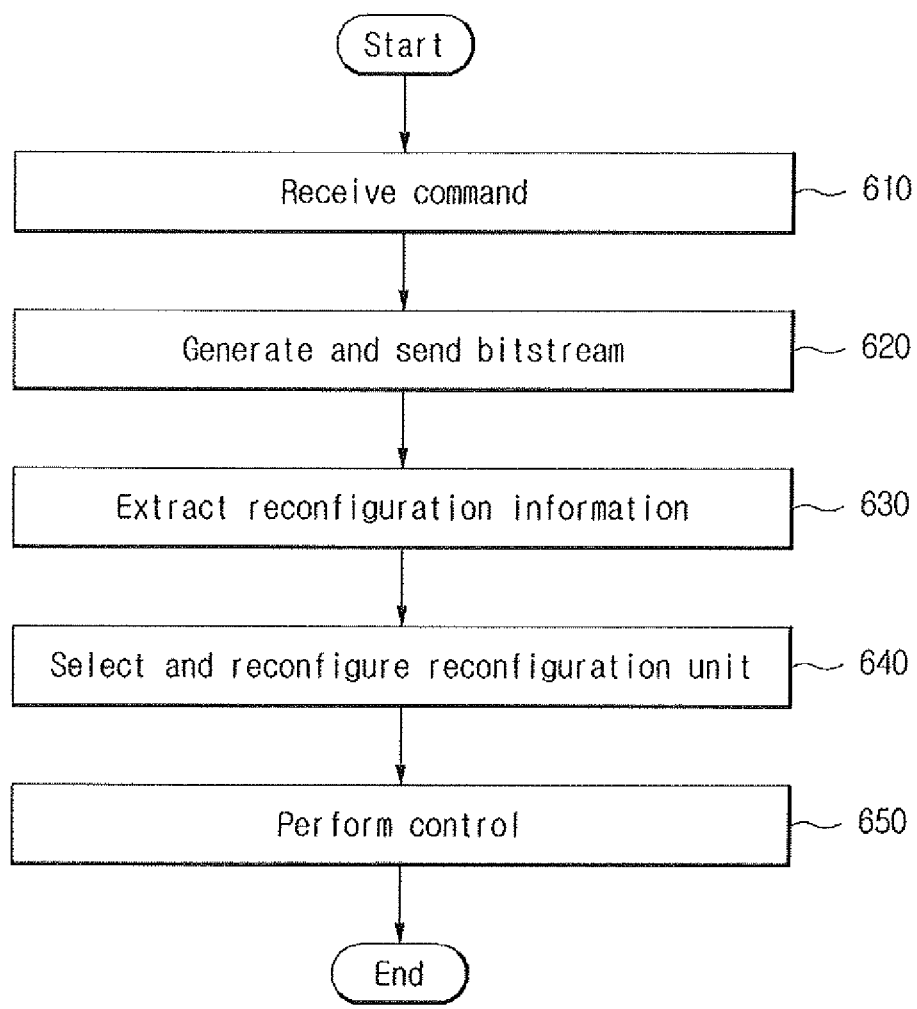
FIG. 6 is a flow diagram illustrating how the control system controls an operation of a servo motor.

FIG. 6 is a flow diagram illustrating how the control system controls an operation of the servo motor.

Referring to FIG. 6, in step 610, the master controller 101 receives a command from an input device.

In step 620, the master controller 101 generates a bitstream for control of the servo motor in accordance with the command received in step 610. Here, the master controller 101 generates a bitstream including reconfiguration information indicating the FPGA structure of a slave controller required for controlling the servo motor according to the command. The master controller 101 sends the generated bitstream to the first slave controller 102.

In step 630, the first slave controller 102 extract reconfiguration information from the received bitstream. Here, after extracting the reconfiguration information, the first slave controller 102 can send the bitstream to the second slave controller 103. The second slave controller 103 that received the bitstream can be operated in the same way as the first slave controller 102 after step 630.

In step 640, the first slave controller 102 reconfigures the structure of the reconfiguration unit, which is an FPGA module, according to the reconfiguration information. Here, the first slave controller 102 reconfigures the second dynamic reconfiguration module 529 in the case that the first slave controller 102 would need to stop controlling the servo motor if the first dynamic reconfiguration module 526, which is currently controlling the servo motor among a plurality of dynamic reconfiguration modules, was reconfigured according to the reconfiguration information. Once reconfiguration of the second dynamic reconfiguration module 529 is completed, the first slave controller 102 can stop the operation of the first dynamic reconfiguration module 526 and control the servo motor by use of the second dynamic reconfiguration module 529 and the static reconfiguration module 523. Moreover, it is possible for the first slave controller 102 to reconfigure the static reconfiguration module 523, the first dynamic reconfiguration module 526 and the second dynamic reconfiguration module 529 independently according to the reconfiguration information. That is, in the case that the reconfiguration information shows the structure of the first dynamic reconfiguration module 526 or the second dynamic reconfiguration module 529 only, the first slave controller 102 can reconfigure the first dynamic reconfiguration module 526 or the second dynamic reconfiguration module 529 while the static reconfiguration module 523 controls the servo motor.

In step 650, the first slave controller 102 controls the operation of the servo-motor by use of the reconfiguration unit that is reconfigured in step 640.

Although it has been described that the control system controls the servo motor, it shall be appreciated that other devices than the servo motor can be controlled by configuring the reconfiguration information to be suitable for other devices.

Hitherto, the present invention has been described in accordance with certain embodiments, but there are many other embodiments in addition to the embodiments described above in the claims of the present invention. Anyone having ordinary skill in the art to which the present invention pertains shall be able to understand that the present invention can be embodied in modified forms without departing from the essential features of the present invention. Accordingly, the disclosed embodiments shall be understood in illustrative views, not in restrictive views. The scope of the present invention shall be defined by the appended claims, not by the above description, and any and all differences within the equivalent scope shall be understood to be included in the present invention.

INDUSTRIAL APPLICABILITY

The control system and the method therefor in accordance with an embodiment of the present invention can flexibly control various devices by reconfiguring a gate array structure according to an input by a user.

The control system and the method therefor in accordance with an embodiment of the present invention can minimize the size of a control device by reconfiguring a gate array structure and controlling the device using the reconfigured gate array.

The invention claimed is:

1. A control system that is reconfigurable during operation, the control system comprising:
   a master controller configured to generate a bitstream including reconfiguration information according to a command of a user; and
   a first slave controller for controlling operation of a first target apparatus, wherein the first slave controller comprises:
   a first dynamic reconfiguration module, which is a field programmable gate array (FPGA) reconfigured according to the reconfiguration information, and which computes a control value;
   a second dynamic reconfiguration module, which is an FPGA reconfigured according to the reconfiguration information, and which computes a control value, and wherein the control unit maintains the operation of the first dynamic reconfiguration module until the second dynamic reconfiguration module is completely reconfigured if the control unit controls the second dynamic reconfiguration module to be reconfigured according to the reconfiguration information; and
   a static reconfiguration module, which is an FPGA controlling an operation of a target apparatus according to the control value from the first dynamic reconfiguration module or the second dynamic reconfiguration module, the static reconfiguration module being operated by being linked to the first dynamic reconfiguration module until the second dynamic reconfiguration module is completely reconfigured, and control of the target by the static reconfiguration module is maintained until the static reconfiguration module and the first dynamic reconfiguration module are operated by being linked to each other;

wherein a control unit reconfigures one or more of the first dynamic reconfiguration module, the second dynamic reconfiguration module and the static reconfiguration module according to the reconfiguration information, wherein the static reconfiguration module maintains control of the target apparatus according to the control value from the first dynamic reconfiguration module or the second dynamic reconfiguration module while one of the first dynamic reconfiguration module and the second dynamic reconfiguration module is reconfiguring, wherein the control unit reconfigures an FPGA structure of the dynamic reconfiguration module independently from the operation of the static reconfiguration module, wherein the control unit controls the second dynamic reconfiguration module to be reconfigured according to the reconfiguration information if the capacity of the reconfiguration information is greater than a predetermined value and maintains the operation of the first dynamic reconfiguration module until the second dynamic reconfiguration module is completely reconfigured, wherein the master controller comprises:
a reconfiguration library storing unit storing function information indicating a connection relation between gates of the first dynamic reconfiguration module or the static reconfiguration module;
a reconfiguration information combining unit extracting the function information according to the command and generating the reconfiguration information by combining the extracted function information;
an entry management unit generating bitstream including the reconfiguration information; and
a slave communication unit transmitting the bitstream to the first slave controller,
wherein, if the entry management unit generates reconfiguration time information, which is time for transmitting the bitstream according to the command, the slave communication unit transmits the bitstream to the first slave controller at every predetermined period or when the bitstream is generated according to the reconfiguration time information.

2. The control system of claim 1, wherein the control unit stops the operation of the first dynamic reconfiguration module if the second dynamic reconfiguration module is completely reconfigured.

3. The control system of claim 1, further comprising a second slave controller, which is a controller having the same configuration as the first slave controller, and wherein the bitsteam includes a first slave identification and a reconfiguration information corresponding to the first slave controller, and a second slave identification and a reconfiguration information corresponding to the second slave controller.

4. The control system of claim 3, wherein the master controller, the first slave controller and the second slave controller are connected in a double-ring structure of network.

5. The control system of claim 1, wherein, in the case that the target apparatus is changed, the static reconfiguration module is an FPGA that is reconfigured according to the reconfiguration information.

6. A method for a reconfigurable control system to control an operation of a target apparatus, the method comprising:
generating a bitstream including reconfiguration information according to a command of a user;
reconfiguring a first field programmable gate array (FPGA), which is reconfigured according to the reconfiguration information;
computing a control value by using the reconfigured FPGA;
transmitting the control value to a second FPGA, which controls the operation of the target apparatus; and
reconfiguring a third FPGA, which is reconfigured according to the reconfiguration information and computes a control value,
wherein an operation of the first FPGA is maintained until the third FPGA is completely reconfigured,
wherein an operation of the second FPGA is maintained according to the control value from the first FPGA or the third FPGA while one of the first FPGA and the third FPGA is reconfiguring,
wherein the reconfiguring of the first FPGA is independent from an operation of the second. FPGA,
wherein the third FPGA is reconfigured according to the reconfiguration information and computes a control value, if the capacity of the reconfiguration information is greater than a predetermined value, and
wherein the generating of the bitstream comprises:
extracting function information from a storage space of the control system that stores the function information indicating a connection relation between gates of the first FPGA or the second FPGA according to the command;
generating the reconfiguration information by combining the extracted function information; and
generating a bitstream including the reconfiguration information.

7. The method of claim 6, further comprising stopping the operation of the first FPGA if the third FPGA is completely reconfigured.

* * * * *